(12) United States Patent
Ishida et al.

(10) Patent No.: US 6,325,571 B1
(45) Date of Patent: Dec. 4, 2001

(54) PARTICULATE OBJECT CONVEYING APPARATUS

(75) Inventors: Migaku Ishida; Akikazu Higuchi, both of Fukuoka (JP)

(73) Assignee: Mitsui High-Tec Inc., Fukuoka (JP)

( * ) Notice: Subject to any disclaimer, the term of this patent is extended or adjusted under 35 U.S.C. 154(b) by 0 days.

(21) Appl. No.: 09/635,440

(22) Filed: Aug. 11, 2000

Related U.S. Application Data

(63) Continuation of application No. 09/162,160, filed on Sep. 29, 1998.

(51) Int. Cl.$^7$ .................................................. B65H 53/66
(52) U.S. Cl. ........................ 406/85; 227/114; 221/162; 221/202; 221/217
(58) Field of Search ........................ 221/162, 233, 221/237, 202, 217; 227/114; 405/85

(56) References Cited

U.S. PATENT DOCUMENTS

| | | |
|---|---|---|
| 811,501 | 1/1906 | Heinrich et al. . |
| 951,412 * | 3/1910 | Baltzer . |
| 1,465,665 | 8/1923 | Grindle . |
| 1,937,747 | 12/1933 | Creasy . |
| 2,772,811 | 12/1956 | Schaef . |
| 3,297,200 | 1/1967 | Andrews et al. . |
| 3,301,606 | 1/1967 | Bruno . |
| 3,308,774 * | 3/1967 | Keeton . |
| 3,373,705 | 3/1968 | Hansen et al. . |
| 3,618,820 * | 11/1971 | Keeton .................. 221/219 |
| 3,627,050 * | 12/1971 | Hansen et al. ............ 111/184 |
| 3,638,829 * | 2/1972 | Frase et al. ............. 221/219 |
| 3,670,671 * | 6/1972 | Lienemann et al. . |
| 3,737,072 | 6/1973 | Deitrick . |
| 3,907,373 | 9/1975 | Jensen et al. . |
| 4,137,854 * | 2/1979 | Lattin . |
| 4,227,863 | 10/1980 | Sommerer . |
| 4,349,280 | 9/1982 | Lödige . |
| 4,450,979 * | 5/1984 | Deckler .................. 221/263 |
| 4,628,841 | 12/1986 | Powilleit . |
| 4,703,868 | 11/1987 | Shaw . |
| 5,005,752 * | 4/1991 | Obst ..................... 227/114 |
| 5,009,330 | 4/1991 | Young et al. . |
| 5,129,930 | 7/1992 | Gauthier et al. . |
| 5,286,451 | 2/1994 | De Silva et al. . |
| 5,323,819 | 6/1994 | Shade . |
| 5,325,801 * | 7/1994 | Fiorido .................. 111/185 |
| 5,609,270 | 3/1997 | Walker . |
| 5,815,914 * | 10/1998 | Kamps et al. ............ 29/798 |
| 5,860,563 | 1/1999 | Guerra et al. . |
| 5,961,700 | 10/1999 | Oliver . |
| 6,022,415 | 2/2000 | Amano . |
| 6,039,511 | 3/2000 | Sakai et al. . |
| 6,053,667 | 4/2000 | Sakai et al. . |
| 6,102,629 | 8/2000 | Ishida et al. . |
| 6,129,045 | 10/2000 | Amano et al. . |

* cited by examiner

*Primary Examiner*—Christopher P. Ellis
*Assistant Examiner*—Richard Ridley
(74) *Attorney, Agent, or Firm*—Greenblum & Bernstein, P.L.C.

(57) ABSTRACT

A particulate object conveying apparatus for conveying particulate objects of indefinite shape, e.g., particulate polycrystalline silicon, one by one, comprises:

a stagnating portion for stagnating particulate objects;

a rotor having a plural number of grooves formed in and equidistantly arrayed on its outer circumference surface, when ascending, the grooves passing the stagnating portion; and object driving-out means for driving the particulate object out of each groove of the rotor.

10 Claims, 3 Drawing Sheets

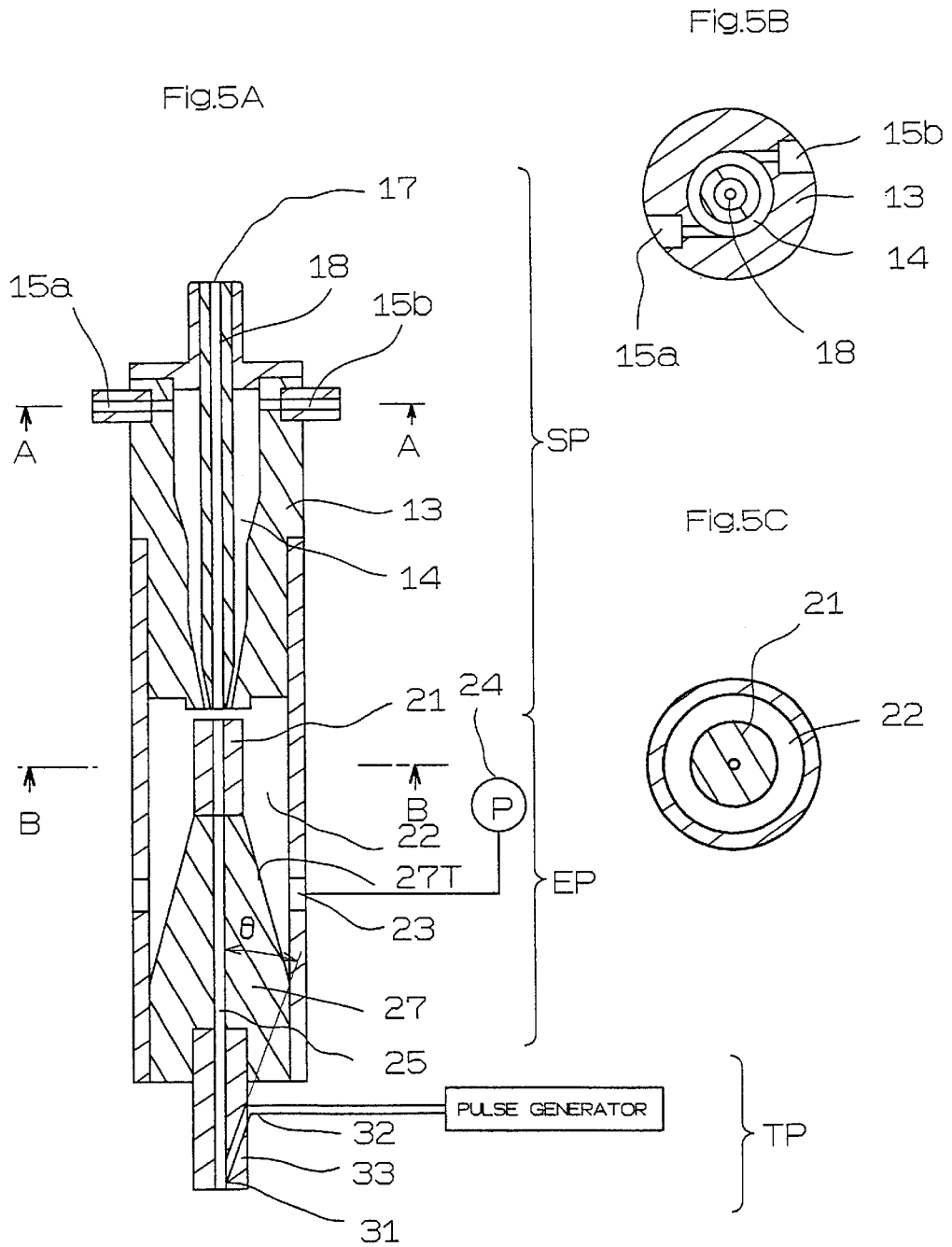

PARTICULATE OBJECT CONVEYING APPARATUS

This application is a continuation of application Ser. No. 09/162,160, filed Sep. 29, 1998, the entire disclosure of which is expressly incorporated by reference herein it its entirety.

BACKGROUND OF THE INVENTION

1. Field of the Invention

The present invention relates to an apparatus for conveying particulate objects between steps to process particulate objects, e.g., particulate polycrystalline silicon, used in manufacturing spherical semiconductor devices.

2. Description of the Related Art

Hitherto, normally, to form semiconductor devices, a method of forming a circuit pattern on a silicon wafer and dicing it as required for forming chips has been adopted. In recent years, an art of forming a circuit pattern on a ball semiconductor of spherical single crystal silicon, etc., having a diameter of 1 mm or less and manufacturing semiconductor elements thereon has been proposed.

For example, a technique to form discrete elements of MOS devices, solar batteries, optical sensors, etc., or semiconductor integrated circuits by use of spherical single crystal silicon has been proposed. To form discrete devices and integrated circuits, particulate objects, e.g., polycrystalline or single crystal silicon balls, obtained by, for example, crushing an ingot into particulate objects of desired size, are subjected to various treatment steps of a grinding step, a lapping step, a mirror polishing step, a washing step, a thin film forming step, a resist application step, a photolithograpy step, an etching step, etc., and conveying steps. A heat treatment step for transforming polycrystalline silicon into single crystal silicon or amorphous silicon is sometimes used. To efficiently manufacture the spherical semiconductor elements, the treatment steps and the conveying steps need to be concatenated to form a line.

The treatment steps are executed in various atmospheres containing not only gases of active gases, inert gases, etc., but also liquids of water, solutions, etc. To efficiently manufacture and treat the spherical semiconductor elements, it is necessary to concatenate the steps of manufacturing and treating the spherical objects of spherical silicon by means of hollow, cylindrical means, e.g., pipes, and to convey the spherical objects within the cylindrical means by the utilization of a conveying force of fluid.

The inventors proposed a spherical object conveying apparatus capable of conveying spherical objects of spherical single crystal silicon, one by one.

Particulate objects of polycrystalline silicon as a starting material are not perfectly spherical and indefinite in shape. Therefore, it is difficult to convey those objects one by one. If two or larger number of the particulate objects are put in the conveying path, it is difficult to automatically convey and treat the particulate objects, and hence it is impossible to treat the particulate objects of spherical silicon within the closed space of the pipe, for example. For this reason, the spherical silicon cannot fully exhibit its advantages, and this fact greatly hinders the progress of the ball semiconductor.

SUMMARY OF THE INVENTION

Accordingly, an object of the present invention is to provide a particulate object conveying apparatus for efficiently conveying particulate objects of indefinite shape, e.g., particulate objects of polycrystalline silicon, one by one.

To achieve the above object, there is provided a particulate object conveying apparatus comprising: a stagnating portion for stagnating particulate objects; a rotor having a plural number of grooves formed in and equidistantly arrayed on its outer circumference surface, when ascending, the grooves passing the stagnating portion; and object driving-out means for driving the particulate object out of each groove of the rotor.(first aspect)

Preferably, a particulate object conveying path including fluid accelerating means using a fluid pressure is coupled to the receiving path.

The particulate object conveying apparatus more effectively operates when the particulate objects are those of polycrystalline silicon being indefinite in shape before the polishing of them.

In the particulate object conveying apparatus thus constructed, particulate objects are put one by one into each groove formed in the outer circumferential surface of the rotor as the rotor rotates. Two or more number of particulate objects mistakenly put into one groove drop by its weight when those are lifted with the rotating rotor and reaches at the highest position. Accordingly, only the particulate objects each put in one groove reach the particulate object receiving path, and are transferred one by one to the receiving path.

The second aspect of the apparatus is an particulate object conveying apparatus according to the first aspect, wherein the depth of each said groove is within the range of 0.5 to 1.5 times as large as the diameter of each said particulate object to be conveyed.

The third aspect of the apparatus is an particulate object conveying apparatus according to the first aspect, wherein said particulate objects are particulate objects of polycrystalline silicon.

The fourth aspect of the apparatus is an particulate object conveying apparatus according to the first aspect, wherein said rotor is shaped like a disc which is rotatable about a rotary shaft 3, and said stagnating portion is provided on one of the sides of said rotor and has a gap of a fixed width, the cross section of said stagnating portion takes a fan-shape spreading out about said rotary shaft, particulate object supplied to the stagnating portion stagnates therein.

The fifth aspect of the apparatus is an particulate object conveying apparatus according to the first aspect, wherein a first spreading angle from the vertex of the fan-shape of said stagnating portion toward the object driving-out means is within the range of 15 to 40 degrees and a second spreading angle from the vertex of the fan-shape of said stagnating portion toward an inlet side of said stagnating portion is within the range of 95 to 120 degrees.

The sixth aspect of the apparatus is an particulate object conveying apparatus according to the first aspect, wherein said particulate object driving-out means comprises a particulate object receiving path disposed under said rotor, and receives the particulate object one by one from said grooves of said rotor when each groove containing a particulate object reaches just above said particulate object receiving path.

The seventh aspect of the apparatus is an particulate object conveying apparatus according to the first aspect, which is further comprising:

a storage section, disposed above said rotor, for storing particulate objects of polycrystalline silicon;

a supplying pipe line of which the inner surface is tapered; and a valve coupled to said supplying pipe line at a location closer to said storage section; wherein the particulate objects of polycrystalline silicon stored in said storage section is guided into said stagnating portion by said supplying pipe line coupled with said valve.

The eighth aspect of the apparatus is an particulate object conveying apparatus according to the sixth aspect, which is further comprising accelerating means, coupled to said receiving path, for accelerating the particulate objects being conveyed through said receiving path by the utilization of a fluid pressure.

The ninth aspect of the apparatus is an particulate object conveying apparatus according to the first aspect, which is further comprising:
  a tubular flow passage, coupled to said particulate object driving-out means,
  spiral stream formation means for allowing a carrier fluid to flow in from a tangent direction of said tubular flow passage and forming a spiral stream of the carrier fluid;
  a supply pipe for supplying a spherical object together with a first atmosphere;
  a first atmosphere suction and discharge section for bringing the first atmosphere containing the spherical object into contact with the spiral stream in the proximity of an exit of said supply pipe for guiding the spherical object so that the spherical object passes through a center and selectively sucking outward and discharging the first atmosphere together with the spiral stream for removing the first atmosphere; and
  a second atmosphere supply section for supplying a second fluid for forming a second atmosphere to the spherical object sent out from said suction and discharge section for sending out the spherical object together with the second fluid.

The tenth aspect of the apparatus is an particulate object conveying apparatus according to the ninth aspect, wherein said first atmosphere suction and discharge section comprises:
  an inner pipe being connected to a point in the proximity of the exit of said supply pipe for enabling a fluid to flow in and out and defining a passage of the spherical object in said inner pipe; and
  a discharge chamber surrounding said inner pipe.

The eleventh aspect of the apparatus is an particulate object conveying apparatus according to the ninth aspect, according, wherein said discharge chamber is a cylindrical pipe formed so as to surround said inner pipe for discharging through discharge holes disposed on an outer peripheral surface in the proximity of a downstream end.

The twelfth aspect of the apparatus is an particulate object conveying apparatus according to the eleventh aspect, wherein the discharge holes comprise a plurality of holes arranged at predetermined intervals on the same circumference along the outer peripheral surface.

The thirteenth aspect of the apparatus is an particulate object conveying apparatus according to the twelfth, wherein the first atmosphere and the spiral stream are made of gases, further including a vacuum chamber disposed like a belt on the outer peripheral surface of said discharge chamber so as to surround all the holes, said vacuum chamber comprising a vacuum pump for discharging the first atmosphere to the outside.

The fourteenth aspect of the apparatus is an particulate object conveying apparatus according to the ninth aspect, wherein said inner pipe is a porous pipe made of a porous material formed so as to define a passage having a diameter slightly larger than that of the spherical object in said pipe.

The fifteenth aspect of the apparatus is an particulate object conveying apparatus according to the ninth aspect, wherein said inner pipe is a pipe having a large number of through holes each having a diameter smaller than that of the spherical object for enabling the first atmosphere to pass therethrough.

The sixteenth aspect of the apparatus is an particulate object conveying apparatus according to the ninth aspect, wherein said inner pipe is a pipe formed of a mesh material capable of preventing the spherical object from flowing out to the outside.

The seventeenth aspect of the apparatus is an particulate object conveying apparatus according to the tenth aspect, wherein said discharge chamber is a cylindrical pipe formed so as to surround said inner pipe with an inner peripheral surface forming a taper face enlarged downstream and approaching an outer peripheral surface of said cylindrical pipe for introducing the spiral stream into the outside.

The eighteenth aspect of the apparatus is an particulate object conveying apparatus according to the seventeenth aspect, wherein the spiral stream is introduced through a discharge hole made in a downstream end of the taper face.

In the specification, the "fluid" contains not only gases of active gases, inert gases, etc., but also liquids of water, solutions, etc., the "particulate object" contains particulate object not only of particulate semiconductors of particulate polycrystalline silicon, particulate amorphous silicon particulate single crystal silicon, particulate gallium arsenite, etc., but also of various materials requiring treatment in various atmospheres the "spherical object" contains spherical object not only of spherical semiconductor of spherical single crystal silicon, spherical gallium arsenite, but also of various materials requiring treatment in various atmospheres.

BRIEF DESCRIPTION OF THE DRAWINGS

FIGS. 5A to 5C are enlarged, sectional views of the particulate object conveying apparatus of FIG. 4.

DESCRIPTION OF THE PREFERRED EMBODIMENTS

The best modes of the invention, which are believed so at present, will be described with reference to the accompanying drawings.

Figure 1:
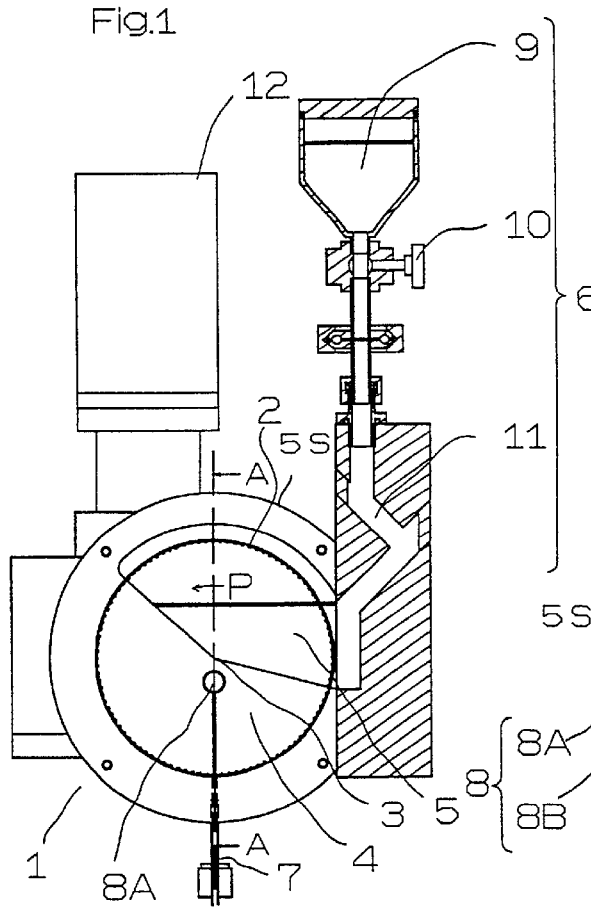
FIG. 1 is a cross sectional view showing a particulate object conveying apparatus which is a first embodiment of the present invention.
Figure 2:
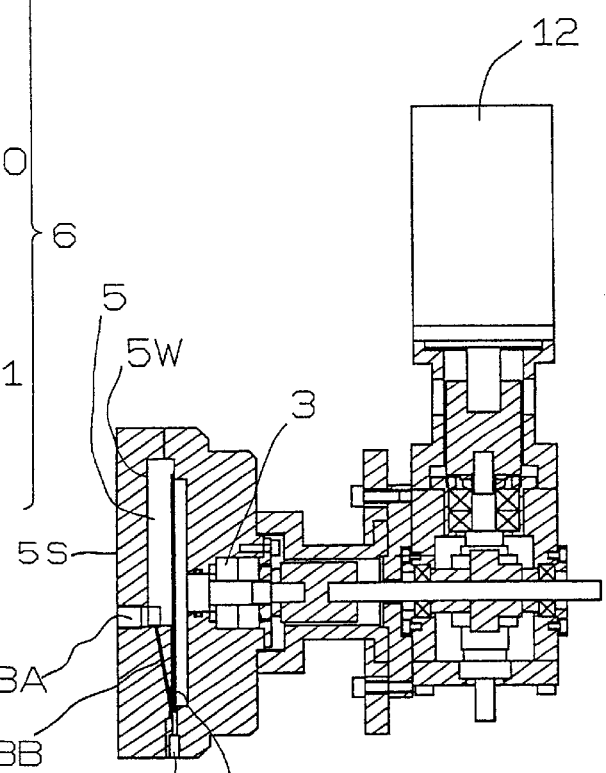
FIG. 2 is a cross sectional view taken on line A—A in FIG. 1.

FIG. 1 is a cross sectional view showing a particulate object conveying apparatus which is a first embodiment of the present invention, and FIG. 2 is a cross sectional view taken on line A—A in FIG. 1.

As shown in FIG. 1, a particulate object conveying apparatus 1 is made up of a rotor 4 which has a plural number of grooves 2 formed in and equidistantly arrayed on its outer circumference surface and is rotatable about a rotary shaft 3, a stagnating portion 5 being provided on one of the sides of the rotor 4 and having a gap of 5–15 mm wide (the cross section of the stagnating portion 5 takes a fan-shape spreading out about the rotary shaft 3, and particulate polycrystalline silicon is supplied from a particulate supplying section 6 to the stagnating portion and stagnating therein), a particulate receiving path 7 for receiving particulate objects of polycrystalline silicon one by one from the grooves 2 of the rotor 4 when each groove 2 containing one particulate object, i.e., one particulate polycrystalline silicon, reaches just above the particulate receiving path 7 (the particulate objects of polycrystalline silicon are transferred from the stagnating portion 5 into the grooves 2, and the grooves 2 containing the particulate objects therein are turned with rotation of the rotor 4, and when each groove 2 reaches just above the particulate receiving path 7, the particulate drops, by its weight, from the groove 2 into the particulate receiving path 7 one by one), accelerating means 8, coupled to the particulate receiving path 7, for accelerating the particulate object being conveyed through the particulate receiving path 7 by use of a pressurized argon gas.

The accelerating means 8 includes a pressurized-gas supplying pipe 8A for supplying an pressurized argon gas to the particulate receiving path 7, and an acceleration pipe 8B.

Figure 3A:
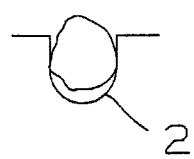
FIGS. 3A and 3B are enlarged, cross sectional views showing a groove of the particulate object conveying apparatus.
Figure 3B:
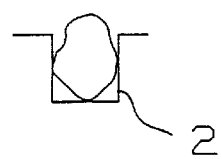

The rotor 4 is shaped like a disc, and the grooves 2 each substantially equal in diameter to one particulate silicon are formed in and equidistantly arrayed over its outer circumference surface (FIGS. 3A and 3B). The rotor 4 is coupled with an apparatus-driving section 12 through the rotary shaft 3, and is rotatable counterclockwise at constant speed in the direction of an arrow A.

A space defining the stagnating portion 5 is shaped like a fan angularly spreading out at an angle 150 degree. Specifically, the space is defined between the recess formed on the outer wall 5W of support plate 5S and the rotor 4. The diameter of the recess is somewhat larger than that of the rotor 4.

The particulate supplying section 6 includes a particulate storage section 9 and a particulate supplying pipe line 11. The particulate storage section 9 stores particulate objects of polycrystalline silicon that are formed by crushing an ingot (lump) of polycrystalline silicon, and filtering out the particulate objects of indefinite shape into particulate objects of predetermined size. The particulate object supplying pipe line 11 of which the inner surface is tapered guides the particulate objects into the stagnating portion 5 by way of a valve 10.

A conveying process of conveying particulate objects of polycrystalline silicon by use of the thus constructed particulate object conveying apparatus will be described.

A polycrystalline silicon lump is crushed by a crushing machine(not shown) and the resultant particulate objects of polycrystalline silicon are fractionated, by a fractionating or filtering device (not shown), into particulate objects of polycrystalline silicon of predetermined size, and the thus sized particulate objects of polycrystalline silicon are stored in the particulate storage section 9. When the valve 10 is opened, the particulate objects of polycrystalline silicon are supplied from the particulate storage section 9 to the stagnating portion 5, through the particulate object supplying pipe line 11.

With rotation of the rotor 4, the particulate objects are fed, one by one, into the grooves 2, which are equidistantly arrayed on the outer circumferential surface of the rotor, in successive manner.

The particulate objects thus put one in one groove 2 are lifted and lowered with rotation of the rotor 4, and is located just above the particulate object receiving path 7. At this time, the particulate object drops, by its weight, into the particulate object receiving path 7. In this case, after the grooves 2 on the outer circumferential surface of the rotor 4 pass a point S, only the particulate object located within each groove is conveyed up to the position just above the particulate object receiving path 7, while two or larger number of particulate objects put in one groove or the particulate objects that are too large in size to be put in one groove drop, by their weight, into the stagnating portion 5 when those are lifted or lowered with rotation of the rotor, whereby those particulate objects do not reach the particulate object receiving path 7.

At the entrance of the particulate object receiving path 7, a pressurized argon gas, supplied from the pressurized-gas supplying pipe 8A, is fed, in a pulsative manner, to each groove through the acceleration pipe 8B, so that the particulate objects are driven out of the grooves one by one at pulse intervals and conveyed through the particulate object receiving path 7.

In this way, the particulate objects of polycrystalline silicon are efficiently and automatically supplied one by one from the particulate object receiving path 7.

Thus, the particulate object conveying apparatus can automatically supply the particulate objects of polycrystalline silicon one by one and can realize a manufacturing process of semiconductor devices in a continuous production line.

Further, one-by-one management of the particulate objects is possible, thereby providing an ease of the quality control.

Additionally, the treatment of the particulate objects is increased inspeed and reduced in cost. A first spreading angle from the vertex of the fan-shape of said stagnating portion toward the object driving-outmeans is within the range of 15 to 40 degrees and a second spreading angle from the vertex of the fan-shape of said stagnating portion toward an inlet of said stagnating portion is within the range of 95 to 120 degrees. If each of the angles is smaller than the smallest value of the angle range, the particulate objects can insufficiently be taken out of the stagnating portion 5. If each of the angles is larger than the largest value of the angle range, the following disadvantage is produced: ??.

A particulate object conveying apparatus which is a second embodiment of the present invention will be described with reference to FIGS. 4 and 5.

As shown, a conveying gas atmosphere conversion device is attached to the particulate object conveying apparatus of the first embodiment already described. The conveying gas atmosphere conversion device has an impurity removal function to remove first atmosphere gas (inert gas) and impurities as well from a particulate polycrystalline silicon measuring 1 mm in diameter, which is supplied, together with the first atmosphere gas, to and present the particulate object receiving path 7, and to send the particulate polycrystalline silicon together with inert gas as second atmosphere gas to the next treatment step. As shown, the conveying gas atmosphere conversion device is composed of a spiral stream formation section SP, a suction and discharge section EP for sucking the first atmosphere gas together with a spiral stream, and a sending section TP for applying a high-pressure pulse of inert gas as a second atmosphere to the particulate object of polycrystalline silicon and sends it while accelerating the same. FIGS. 5B and 5C are cross sectional views taken on lines A—A and B—B in FIG. 5A.

The spiral stream formation section SP is made up of an inner pipe of a teflon pipe measuring about 2 mm in inner diameter adapted to allow a particulate polycrystalline silicon together with first atmosphere gas to pass through from a supply port 17 connected to a conveying apparatus 1, an outer pipe 13 measuring about 15 mm in inner diameter disposed so as to surround the inner pipe 12, a first transport passage 14 defined between the outer pipe 13 and the inner pipe 12, and two high-pressure supply ports 15a and 15b disposed so as to become symmetrical with respect to a point about the center axis so as to communicate with the first transport passage 14 and piercing the outer wall of the outer pipe 13 for supplying high-pressure gas from the tangent direction. Inert gases are spouted from the high-pressure supply ports 15a and 15b, thereby forming a spiral stream along the pipe wall of the inner pipe 12.

The suction and discharge section EP is made up of a collection pipe 21 separated from the lower end of the inner pipe 12 by a predetermined distance and made of a porous pipe having a larger diameter than the inner pipe and a cylindrical discharge chamber 22 disposed surrounding the collection pipe. The space in the discharge chamber 22 for sucking and discharging first reactive gas is concatenated with a discharge pump 24 as a pressure reducing device and a collection tank (not shown) cooled to a predetermined temperature through piping from discharge holes 23 disposed along the outer periphery of the downstream portion.

The collection pipe 21 communicates with the inner pipe 12 and measures about 2 mm in inner diameter almost like the inner pipe 12 and about 4 mm in outer diameter. The inside of the discharge chamber 22 is placed in a reduced pressure state by the discharge pump 24, whereby it becomes a negative pressure state relative to the inside of the collection pipe 21 and a particulate polycrystalline sent together with gas containing a first atmosphere gas from the conveying device 1 comes in contact with a spiral stream rectified through the transport passage 14 at an open end of the inner pipe 12, adiabatically expands in the larger-diameter collection pipe 21, and is efficiently discharged to the discharge chamber 22 together with the spiral stream.

The discharge chamber 22 forms a taper face widening outward downstream from the collection pipe 21 so that the first atmosphere gas discharged through the collection pipe 21 is efficiently discharged forming a laminar flow along the taper face 27T.

As shown in FIG. 5C, the first reactive gas passes through the discharge holes 23 disposed at predetermined intervals along the outer periphery in the proximity of the downstream end of the discharge chamber 22 and is collected in the collection tank (not shown) by the discharge pump 24.

The porous material used to form the collection pipe is obtained by a method of sintering ceramic, resin, metal powder, etc. A large number of through holes are made in the side walls of the collection pipe 21 positioned in the discharge chamber 22.

The collection pipe 21 is connected at the downstream end to a discharge pipe 25 of a teflon pipe having almost the same inner diameter as the inner pipe and the discharge pipe 25 is connected to the sending section 30 where the particulate polycrystalline silicon is accelerated by inert gas spouted as a high-pressure pulse and is sent.

The sending section TP comprises an acceleration pipe 31 and a branch pipe and the acceleration pipe 31 is joined at the upper end to the discharge pipe 25 by a joint tube 33. Branch angle θ of the branch pipe 32 is selected so that the second carrier gas is supplied in a pulse state through a pulse generator (not shown) to the branch pipe 32 and the accelerated inert gas accelerates the particulate polycrystalline silicon and sends it at any desired speed. The branch angle θ is not limited if the particulate polycrystalline silicon can be accelerated. However, preferably the branch angle θ least 45 degrees or less, particularly preferably 30 degrees or less, because if the branch angle θ becomes larger than 45 degrees, it is feared that the inert gas as a second carrier gas may flow back into the joint tube, interfering with a move of the particulate polycrystalline silicon.

Next, the operation of the apparatus comprising the atmosphere conversion function of the second embodiment of the invention will be discussed.

The conveying apparatus is operated same as the first embodiment and explanation is omitted.

Sequentially, thereafter, the space in the discharge chamber 22 is placed in a negative pressure state relative to the space in the collection pipe by the action of the discharge pump 24 and the inside of the collection pipe 21 made of porous material is also placed in a negative pressure state. Since the inside of the collection pipe 21 is under a negative pressure, first atmosphere gas containing a particulate polycrystalline silicon sent from the inner pipe 12 in the proximity of the boundary between the collection pipe and the inner pipe 12 comes in contact with an spiral stream formed in the first transport passage 14 and rectified along the outer walls of the inner pipe 12, adiabatically expands, is sucked by the discharge pump, and is discharged smoothly through the discharge chamber 22 and the discharge holes to the discharge chamber 22.

On the other hand, the particulate polycrystalline silicon from which the first atmosphere gas is removed is accelerated by a pulse of the inert gas as a carrier gas of inert gas in the sending section 30 and is sent at predetermined intervals.

Thus, the particulate polycrystalline silicon together with the carrier gas of inert gas, etc., is accelerated in a state in which the atmosphere of mono-silane ($SiH_4$), $N_2O$ gas, etc., used in the preceding step is removed, and is sent to the following step in a constant interval.

Preferably, the space in the discharge chamber 22 is controlled to a predetermined temperature to efficiently collect the atmosphere.

The collection pipe 21 is made of a porous material, but the invention is not limited to it. A large number of through holes may be made in the side walls of the collection pipe 21 positioned in the discharge chamber 22. Ceramic, resin, metal, or each of the materials coated with a resin, or the like matched with the transport atmosphere, such as inert gas or water, can be used as the material of the collection pipe 21. The number of the through holes made in the side walls of the collection pipe 21 and the bore of each through hole can be set arbitrarily in a range not interfering with smooth conveying of particulate objects.

The collection pipe 21 may also be made of a porous material provided by sintering ceramic, resin, metal, etc. In this case, through holes need not be made in the side walls of the collection pipe 21, thus the cost of manufacturing the collection pipe can be reduced. Gases, etc., in the collection pipe 21 are introduced into the collection tank through the discharge chamber 22 over a wide area due to the differential pressure caused by the actuation of the discharge pump. The first atmosphere gas together with the spiral stream is removed efficiently from the full inner peripheral surface, thus is hard to remain in the collection pipe.

To use a resin as the material of the collection pipe 21, fluororesin is preferred from the viewpoints of heat resistance, chemical resistance, and sinter moldability.

Preferably, inert gas for forming a spiral stream is controlled to a predetermined temperature, whereby while the inert gas passes through the first transport passage 14 and is rectified, the particulate polycrystalline silicon and the first atmosphere gas in the inner pipe 18 can also be heated or cooled.

If it is necessary to remove the remaining reactive gas in the preceding step for replacing the atmosphere completely, the exhaust efficiency of an discharge chamber may be raised or more than one apparatus may be connected in series.

According to the apparatus of the second embodiment, by the multi-steps of forming the spiral stream, the particulate polycrystalline silicon can be conveyed to the next step without contacting to inner wall of the discharge pipe 25. Therefore the particulate polycrystalline silicon can be prevented from being damaged. Since the particulate polycrystalline silicon itself has indefinite shape, the particulate polycrystalline silicon is conventionally easy to harm inner wall of the discharge pipe 25 and to be contaminated itself by peeling off the inner wall adhesive of the discharge pipe. Contrary that, according to the apparatus of the second embodiment, since the particulate polycrystalline silicon can be conveyed to the next step without contacting the inner wall of the pipe and in a high quality and pure state by being removed a impurity contained.

To manufacture MOS devices, solar batteries, etc byusing the particulate polycrystalline silicon as a raw material and processing it into spherical single crystal silicon, such a conveying apparatus so enables the devices to be formed without being taken out to the air by combining a transport passage, a rotary relay, gases, etc., in a closed space.

Figure 4:
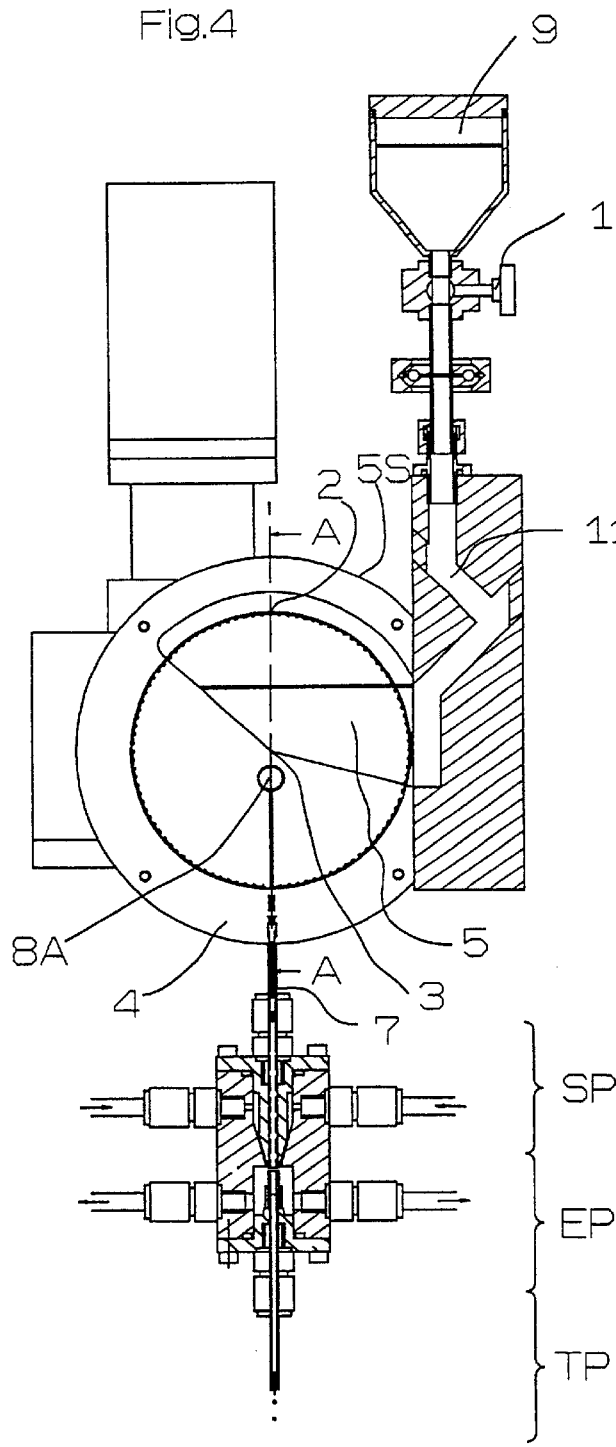
FIG. 4 is a cross sectional view showing a particulate object conveying apparatus which is a second embodiment of the present invention.

For example, MOSFET can also be formed in a closed space without touching the air only by preparing a particulate polycrystalline silicon and conveying it by the conveying apparatus as shown in FIG. 4, processing it into spherical single crystal silicon, polishing in a polishing device, and supplying and discharging controlled gases.

That is, first, particulate polycrystalline silicon is conveyed, cleaned, polished into a spherical shape, and annealed into spherical single crystal silicon. And then the spherical single crystal silicon is washed, a natural oxide film on the surface is removed, a gate insulating film is formed by thermal oxidizing, and a polycrystalline silicon layer is formed by executing a CVD step, then a gate electrode is formed by patterning the polycrystalline silicon layer by executing a photolithography step.

After an interlayer insulating film is formed, a polycrystalline silicon film containing desired impurities is formed on the surface, source/drain diffusion is executed from the polycrystalline silicon film for forming source/drain regions, and the polycrystalline silicon layer is used as a source/drain contact layer.

Last, electrode formation is executed, whereby MOSFET is formed in a closed space extremely efficiently.

As described above, the particulate object conveying apparatus can carry out a surface treatment as desired in an extremely small amount of gas, and can convey the particulate objects of polycrystalline silicon in non-contact manner by the utilization of the spiral stream. This accrues to the production of semiconductor devices suffering from no stripping-off and no physical damage and with increase of production yield and high reliability. While supply and discharge of gases were described in the embodiments mentioned above, the present invention is applicable to a case where liquid is used instead of the gases.

What is claimed is:

1. A particulate object conveying device for conveying particles of a predetermined size, comprising:

a stagnating portion;

a disc shaped rotor having an outer circumference with a plurality of grooves formed equidistantly about said outer circumference, said grooves being of a fixed size and shape to hold only a single one of said particles of predetermined size, said rotor rotating within said stagnating portion about a rotary shaft, said stagnating portion being disposed on a side of said rotor and having a gap, said stagnating portion having a cross section defined substantially by two radial lines and an arcuate line to form a partial section of a circle, wherein excess particles taken up in movement of said rotor fall into said stagnating portion;

a discharge path for discharging said particles from said rotor;

a storage section, disposed above said rotor, for storing particulate objects of polycrystalline silicon;

a supplying pipeline having an inner tapered surface, said pipeline connecting said storage section to said stagnating portion; and a valve disposed in said pipeline closer to said storage section than said stagnating portion.

2. The device of claim 1, further comprising an accelerating device, operating cooperatively with said discharge path, to provide fluid under pressure to accelerate the movement of said particles through said discharge path.

3. A particulate object conveying device for conveying particles of a predetermined size, comprising:

a stagnating portion;

a disc shaped rotor having an outer circumference with a plurality of grooves formed equidistantly about said outer circumference, said grooves being of a fixed size and shape to hold only a single one of said particles of predetermined size, said rotor rotating within said stagnating portion about a rotary shaft, said stagnating portion being disposed on a side of said rotor and having a gap, said stagnating portion having a cross section defined substantially by two radial lines and an arcuate line to form a partial section of a circle, wherein excess particles taken up in movement of said rotor fall into said stagnating portion;

a discharge path for discharging said particles from said rotor;

a tubular flow passage coupled to said discharge path;

a spiral stream device that allows a fluid into said flow passage from a tangential direction to create a spiral stream of said fluid;

a supply pipe, connected to said discharge path, that receives one of said particles suspended in a first atmosphere;

a first section in which said one of said particles and said first atmosphere contact said spiral stream in proximity to an exit of said supply pipe such that said first atmosphere is separated from said one of said particles; and a second section that suspends said one of said particles in a second atmosphere, and discharges said one of said particles and said second atmosphere.

4. The device of claim 3, wherein said first section further comprises:
- an inner pipe connected to said supply pipe; and
- a discharge chamber surrounding said inner pipe in which said spiral stream forms.

5. The device of claim 4, wherein said discharge chamber is a cylindrical pipe that surrounds said inner pipe, and has a plurality of discharge holes adjacent a downstream end of said cylindrical pipe.

6. The device of claim 5, wherein said discharge holes are positioned equidistantly at predetermined intervals about said cylindrical pipe.

7. The device of claim 6, wherein said first atmosphere and said fluid are gasses.

8. The device of claim 6, further comprising a vacuum chamber surrounding said plurality of holes, said vacuum chamber comprising a vacuum pump.

9. The device of claim 4, wherein said inner pipe is porous, and has a diameter larger than said one of said particles.

10. The device of claim 5, wherein said inner pipe is made of mesh material.

* * * * *